United States Patent [19]

Okabe et al.

[11] Patent Number: 4,853,755

[45] Date of Patent: Aug. 1, 1989

[54] METHOD FOR MANUFACTURING A THIN-FILM TRANSISTOR ARRAY AND A THIN-FILM TRANSISTOR ARRAY MANUFACTURED BY THE METHOD

[75] Inventors: Kazuya Okabe, Moriya; Hideyuki Matsuda, Iwaki; Chisato Iwasaki; Satoshi Fujimoto, both of Furukawa, all of Japan

[73] Assignee: Alps Electric Co., Ltd., Japan

[21] Appl. No.: 170,996

[22] Filed: Mar. 17, 1988

[30] Foreign Application Priority Data

Apr. 23, 1987 [JP] Japan .................................. 62-100909

[51] Int. Cl.$^4$ ............................................. H01L 29/78
[52] U.S. Cl. ..................................... 357/23.7; 357/86; 357/4
[58] Field of Search ............................. 357/23.7, 86, 4

[56] References Cited

U.S. PATENT DOCUMENTS

| | | | |
|---|---|---|---|
| 4,736,229 | 4/1988 | Holmberg | 357/23.7 |
| 4,792,210 | 12/1988 | Maurice | 357/23.7 |
| 4,799,097 | 1/1989 | Szluk | 357/23.7 |

Primary Examiner—Martin H. Edlow
Attorney, Agent, or Firm—Guy W. Shoup; Paul J. Winters; Stephen L. Malaska

[57] ABSTRACT

In a thin-film transistor array, a plurality of gate buses and a plurality of source buses are formed on a substrate in such a manner that said gate buses are intersected with said source buses at crossover portions, and a plurality of thin-film transistors are formed on the substrate adjacent to the crossover portion, which are connected to the gate buses and source buses for a driving purpose.

Furthermore, an auxiliary bus is formed on either the gate buses, or source buses, shortcircuited portions of which are cut out by means of laser trimming so as to conduct the gate buses or source buses.

1 Claim, 9 Drawing Sheets

METHOD FOR MANUFACTURING A THIN-FILM TRANSISTOR ARRAY AND A THIN-FILM TRANSISTOR ARRAY MANUFACTURED BY THE METHOD

BACKGROUND OF THE INVENTION

1. Field of the Invention

The present invention relates to, a thin-film transistor for switching display elements and sensor elements, and also to a method for manufacturing a thin-film transistor array (referred to as a "TFT" array hereinafter).

2. Description of the Related Art

In a TFT array to active-matrix-drive a liquid crystal element, as illustrated in FIGS. 8 and 9, there are provided a large quantity of gate buses 2 and of source buses 3 which are intersected with each other. They are made of, e.g., molydenum and formed on a glass substrate 1. The source bus 3 runs over the gate bus 2 at a crossover portion 4 where these gate buses 2 and source buses 3 are intersected with each other. As shown in FIG. 9, an insulating film 5 is employed between the gate bus 2 and source bus 3 not to electrically conduct these two buses 2 and 3 with each other. This insulating film 5, as illustrated in FIG. 9, includes a first insulating film 6 made of silicon nitride, formed on the gate bus 2, and a second insulating film 8 made of amorphous siliconhydride, which is simultaneously formed when a semiconductor film of a TFT 7 is formed on this first insulating film 6. That is to say, this insulating film 5 is a double layer structure. A passivation film 9 made of, e.g., silicon nitride is formed over an entire surface of the substrate 1 including the source bus 3.

As shown in FIG. 8, a gate line 10 and a source line 11 are branched from the respective gate bus 2 and source bus 3 adjacent to the crossover portion 4, and then connected to the corresponding gate electrode and source electrode of TFT 7 which has been formed near the crossover portion 4. This TFT (thin-film transistor) 7 is arranged by a gate insulating film which is made of, e.g., silicon nitride and formed on the gate electrode while the above-described first insulating film 6 is formed; a semiconductor film made of amorphous siliconhydride which is formed on this gate insulating film; a source electrode and a drain electrode which are made of, e.g., aluminium and simultaneously formed on this semiconductor film when the source bus 3 is formed; and a light shield 12 which is made of, e.g., aluminium and covers the semiconductor film over which a passivation film 9 is formed. The drain electrode of this TFT 7 is connected to a pixel electrode 13.

In such a TFT array, shortcircuit defects may unavoidably occur due to various reasons of the TFT array manufacturing process. As these shortcircuit defects, there are shortcircuit problems occurring at the crossover portion 4 between the source bus 3 and gate bus 2, and between the gate electrode and source electrode. Such a shortcircuit defect appears as a line defect, or a point defect when being arranged with a liquid crystal display element, which causes the lower display characteristic of the liquid crystal display element.

As a result, various defect preventing methods have been proposed so as to recover such a shortcircuit defect occurring at a thin-film transistor array, whereby occurrence of the line defect or point defect of the liquid crystal display element can be prevented.

Referring now to FIGS. 8 and 9, one of the conventional method for recovering the shortcircuit defect will be described.

First, under the condition where the passivation film 9 is not yet formed, the insulating inspection, or examination is carried out between one terminal G1 of the gate bus 2 and one terminal S1 of the source bus 3 so as to detect whether or not there is a shortcircuit problem between the gate bus 2 and source bus 3. If the shortcircuit problem is detected, the source bus 3 at a position a between the crossover portion 4 of the source bus 3 and the branching point of the source line 11 is cut out by the laser trimming treatment. As the laser trimming treatment, a YAG laser is normally employed. In the next stage, the insulating inspection is again performed between the terminal G1 of the gate bus 2 and the terminal S1 of the source bus 3. If the gate bus terminal G1 is electrically conducted to the source bus terminal S1, it can be detected that the shortcircuit problem is produced at the crossover portion 4. Consequently, the shortcircuited position of TFT array can be defined. In this case, the position b of the source bus 3, i.e., the portion near the terminal S1 of the crossover portion 4 is cut out by the laser trimming treatment. If the gate bus terminal G1 is not electrically conducted to the source bus terminal S1 during the above-described second insulating inspection, another insulating inspection is subsequently performed between the terminal G1 of the gate bus 2 and the other terminal S2 of the source bus 3. Then, if the gate bus terminal G1 is electrically conducted to the source bus terminal S2, it can be detected that the gate-to-source path of TFT 7 is shortcircuited. As a result, the shortcircuited position can be specified. In this case, the position c of the source bus 3 adjacent to the terminal S2 of the branching point of the source line 11 is cut out by the laser trimming.

As a consequence, the shortcircuit defects occurring at two positions are completely cut out from the source bus 3 located on both sides of these shortcircuited positions. When power is supplied via both terminals S1 and S2 of the source bus 3 to TFT array during the driving operation, TFT 7 is not brought into operation, but other TFTs are operable so that the above-described line defect can be avoided.

According to the above-described conventional method, after the shortcircuit defect has been recovered, the passivation film 9 is formed over the entire surface of the substrate 1, and then, the light shield for TFT 7 is formed. Thereafter, the resultant substrate 1 is transferred to the subsequent liquid crystal injection step.

Since, however, the power must be supplied via both terminals of the source bus to the TFT array so as to drive the liquid crystal display element, the total number of the required terminals is twice as much as the number of the source bus. Consequently, the respective terminals must be juxtaposed, resulting in occurrence of the shortcircuit problems.

Moreover, if there are more than two shortcircuit problems at a single source bus, no power is supplied to TFT located between these shortcircuited positions. If these shortcircuited positions are separated from each other, the point defects will be continued when driving the liquid crystal display element, which then seems to be the line defect.

SUMMARY OF THE INVENTION

It is therefore an object of the invention to provide a method for solving these conventional drawbacks, where after the shortcircuited portion is cut out from the source bus or gate bus by laser-trimming either the source bus, or gate bus located on both sides of the shortcircuited defect position, the passivation film is formed and subsequently, an auxiliary bus is formed so as to conduct the cut source buses, or cut gate buses with each other.

Accordingly, since the cut source buses, or gate buses are conducted by means of the auxiliary bus, the power can be supplied via either terminal to the TFT array. In addition, even if there are more than two shortcircuited positions at the gate bus or source bus, the power can be supplied to TFT located between these shortcircuited positions. If the formation of the auxiliary bus is simultaneously performed when the light shield of TFT is formed, the total processing number is not increased.

BRIEF DESCRIPTION OF THE DRAWINGS

The above purpose and other useful and novel features of the present invention will become more readily apparent in the following description of the accompanying drawings, in which.

DETAILED DESCRIPTION OF THE PREFERRED EMBODIMENTS

Figure 1:
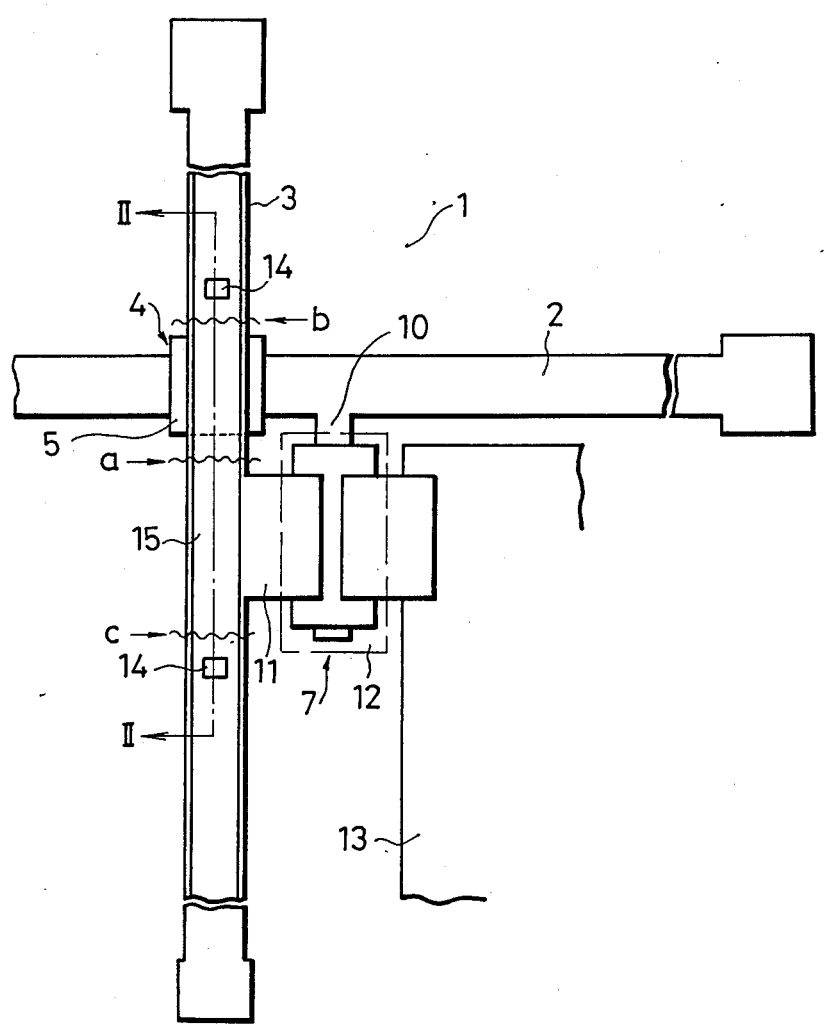
FIG. 1 is a plan view of a TFT array according to a first preferred embodiment of the invention.
Figure 2:
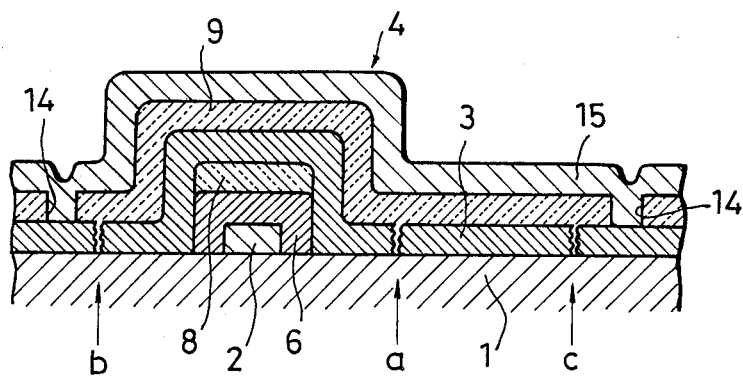
FIG. 2 is a cross-sectional view taken along II—II line of the TFT array shown in FIG. 1.
Figure 8:
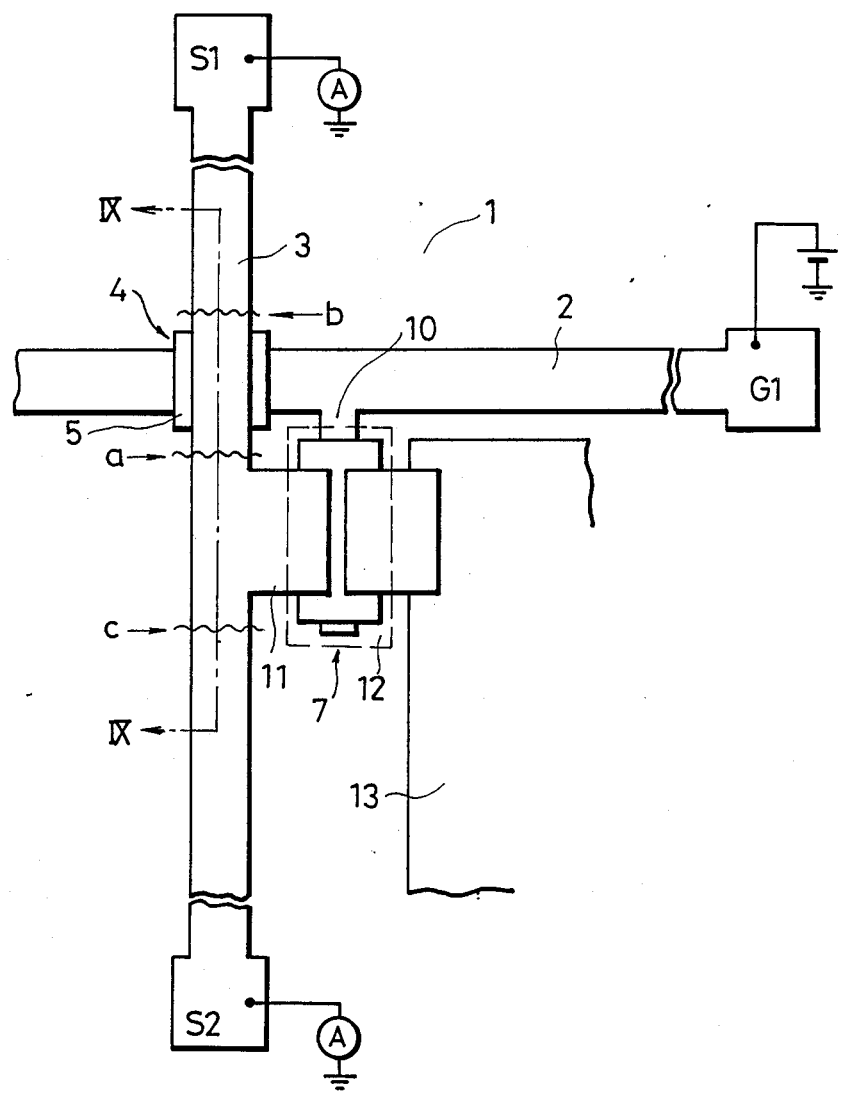
FIG. 8 is a plan view of the conventional TFT array.
Figure 9:
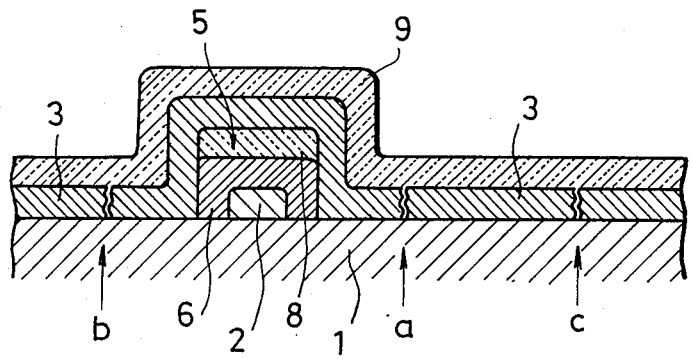
FIG. 9 is a cross-sectional view taken along IX—IX line of the conventional TFT array shown in FIG. 8.

FIGS. 1 and 2 show a TFT (thin-film transistor) array according to a first preferred embodiment of the invention. The different points between this TFT array shown in FIGS. 1 and 2 and the conventional TFT array shown in FIGS. 8 and 9 are as follows. An auxiliary bus 15 for conducting source buses 3 which are laser-trimmed on the passivation film 9, is formed.

That is to say, the shortcircuit defect is cut out at the respective positions a, b and c of the source bus 3, and thereafter, the passivation film 9 made of, e.g., silica ($SiO_2$) is formed over the entire surface of the substrate 1. In this case, as illustrated in FIGS. 1 and 2, contact holes 14, 14 are formed, so as to expose a portion of the source bus 3, at the position adjacent to the outer terminal for the cut portions a and c of the source bus 3. Thereafter, the light shield 12 for covering the semiconductor film of TFT 7 is formed on this passivation film 9. When the light shield 12 is formed, the band-shaped auxiliary bus 15 is simultaneously formed in parallel with the source bus 3. The auxiliary bus 15 is electrically connected to the source bus 3 underlaying the respective contact holes 14 and 14, so that all of the cut source buses 3 are connected to each other by means of this auxiliary bus 15. It should be noted that although a length of the auxiliary bus 15 is required to sufficiently connect these cut-out source buses 3, a large quantity of contact holes may be formed is to reach both terminals.

Figure 3:
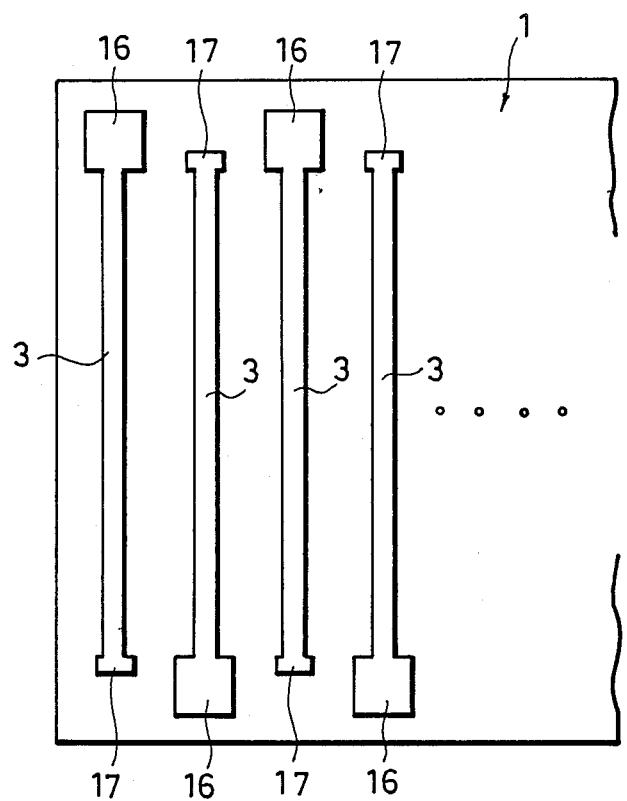
FIG. 3 schematically shows a plan view of the power supply terminals of the TFT array shown in FIG. 1.

With the above-described TFT array structure, the source buses where no shortcircuited portions are present become conductive by way of the auxiliary bus, even if the source bus 3 is cut out by the laser trimming treatment. As a result, the power can be supplied to the source bus 3 via only one terminal so that the total number of the terminals can be reduced to a half. As illustrated in FIG. 3, for instance, the power supply terminal 16 of the source bus 3 is employed only at one terminal thereof, whereas a small pad to be used as the insulating inspection is formed on the other terminal. Such source buses 3 are alternately positioned to form an array. Accordingly, one power supply terminal may be formed in a large size and the intervals between the adjoining terminals can be widened.

In addition, since the TFT located between the shortcircuited portions can be powered even if there are more than two shortcircuited portions on a single source bus 3, the total number of the point defects can be reduced and therefore yield can be improved.

Figure 4:
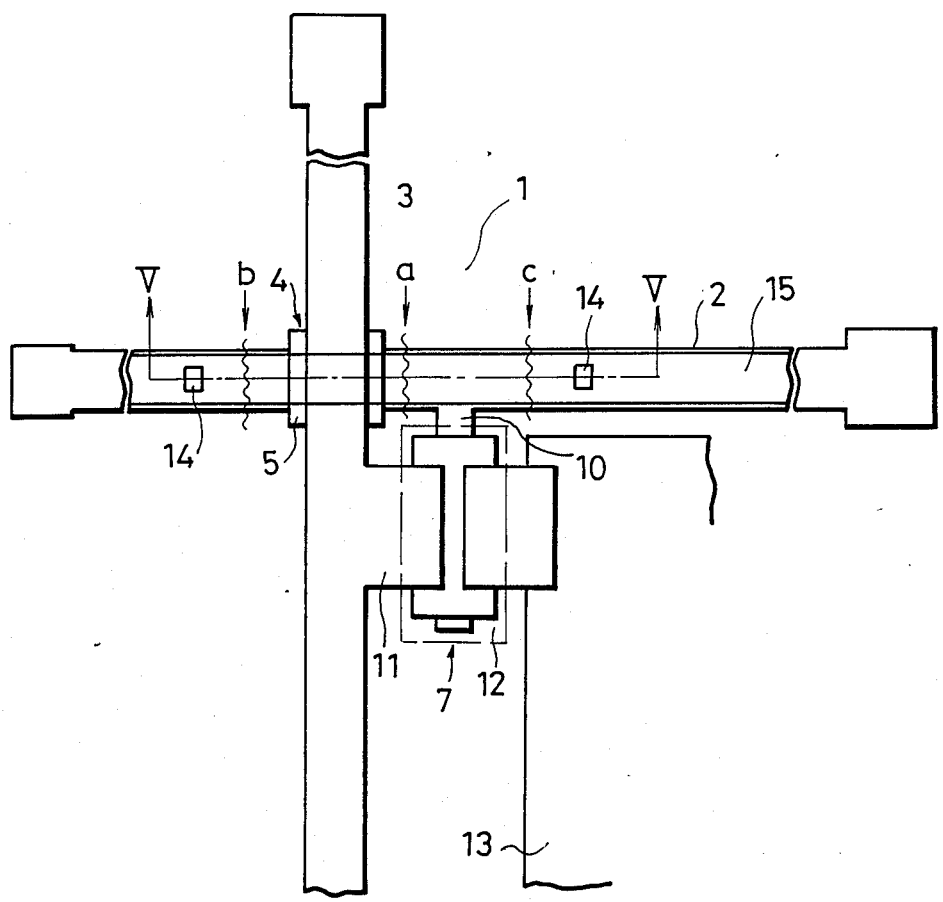
FIG. 4 is a plan view of a TFT array according to a second preferred embodiment of the invention.
Figure 5:
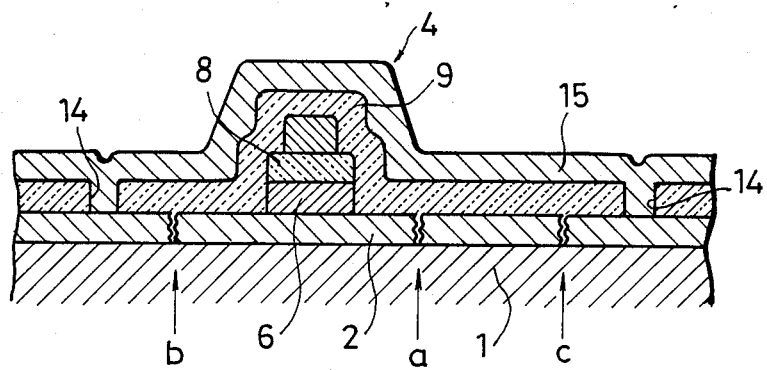
FIG. 5 is a cross-sectional view taken along V—V line of the TFT array shown in FIG. 4.

FIGS. 4 and 5 illustrate a TFT array according to a second preferred embodiment of the invention. That is to say, recovering the shortcircuit defects is executed by laser-trimming the gate bus 2. Also in the preferred embodiment, contact holes 14 and 14 are formed at the positions adjacent to the terminals other than the cut portions of the gate bus 2, and a band-shaped auxiliary bus 15 is formed on the passivation film 9 along the gate bus 2 in a parallel form. Then, the cut gate buses 2 are connected by this auxiliary bus 15.

Figure 6:
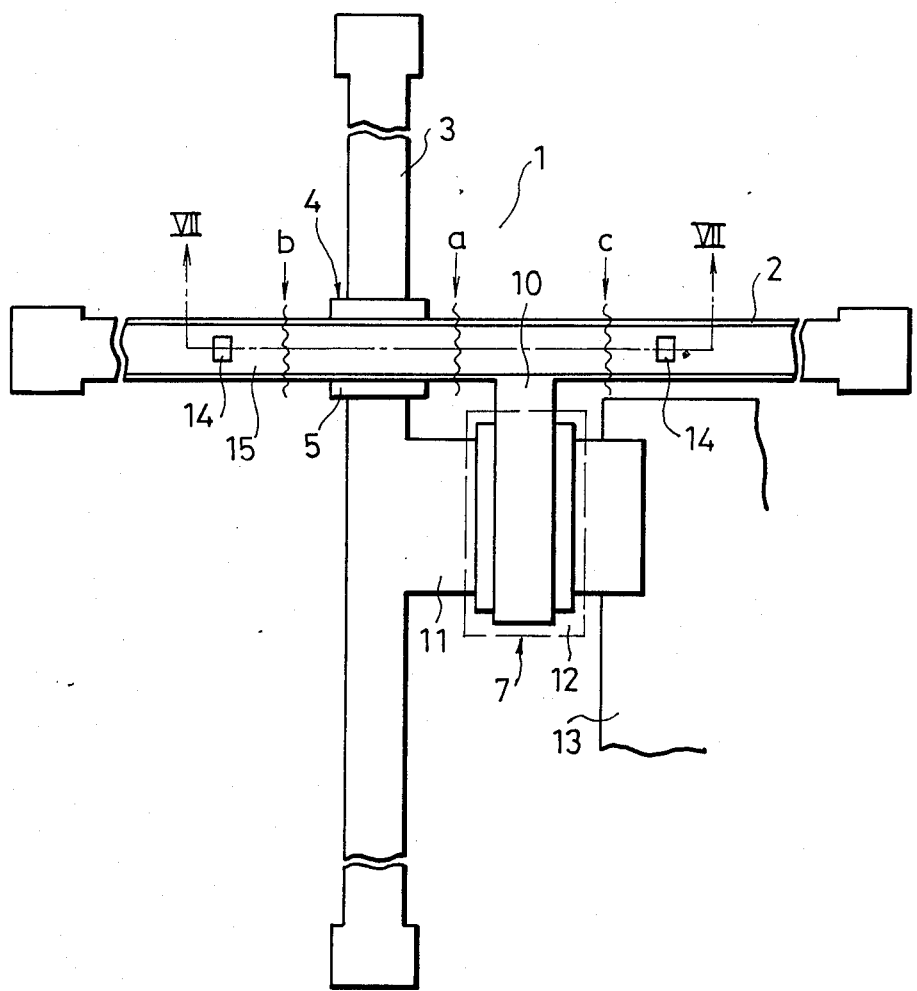
FIG. 6 is a plan view of a TFT array according to a third preferred embodiment of the invention.
Figure 7:
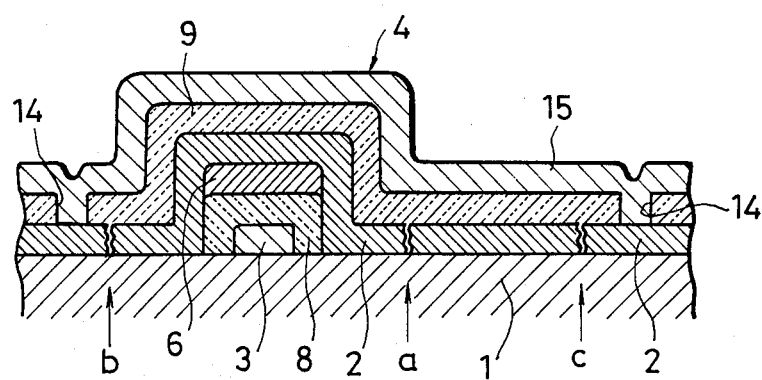
FIG. 7 is a cross-sectional view taken along VII—VII line of the TFT array shown in FIG. 6.

FIGS. 6 and 7 show a TFT array according to a third preferred embodiment of the invention. This TFT array is a forward staggered structure where a stacked structure of the source and drain of the TFT 7 is reversed, and the gate bus 2 is overlayed on the source bus 3. The shortcircuited portion is cut out from the TFT array by laser-trimming the gate bus 2. Similarly, as illustrated in FIG. 7, the auxiliary bus 15 is formed on the passivation film 9 in such a manner that this auxiliary bus 15 bridges over the cut portion of the gate bus 2. Also in such a formed staggered structure, the source bus 3 is laser-trimmed, and the auxiliary bus is formed in the similar manner, thus obtaining the same advantage as that of the second preferred embodiment.

While has been described in above, the TFT array and the manufacturing method thereof according to the present invention are characterized by that either the source buses or gate buses located on both sides of the shortcircuited portion are laser-trimmed so as to electrically separate the shortcircuited portion from the source buses or gate buses, and the auxiliary bus is employed to electrically conduct the cut source bus, or gate bus. As a result, to supply power to the TFT array, only the power supply terminal of either the source bus, or gate bus is sufficient. Therefore, the total number of the required power supply terminals can be reduced into a half, and also large-sized terminals may be employed. As a merit, the interval between the successive terminals can be widened, so that occurrence of the shortcircuit problems between the adjoining terminals can be reduced. Even if there are more than two shortcircuited potions in a single source bus, or a single gate bus, the power can be supplied to the TFT located between these shortcircuited portions. As a consequence, the total number of the inoperative TFTs can be reduced, resulting in an increase of yield of the TFT array.

What is claimed is:

1. A thin-film transistor array wherein a plurality of gate buses and a plurality of source buses are formed on a substrate in such a manner that said gate buses are intersected with said source buses at crossover portions, and a plurality of thin-film transistors are formed on the substrate adjacent to the crossover portion, which are connected to said gate buses and source buses for a driving purpose, characterized in that an auxiliary bus is formed on either the gate buses, or source buses, short-circuited portions of which are cut out by means of laser trimming, so as to conduct said gate buses or source buses.

* * * * *